United States Patent
Metz et al.

(10) Patent No.: US 7,305,490 B2
(45) Date of Patent: Dec. 4, 2007

(54) PREPARING ELECTRONIC DATA FOR TRANSMISSION

(75) Inventors: Kristofer Erik Metz, Meridian, ID (US); Nolan W. Letellier, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 902 days.

(21) Appl. No.: 10/629,886

(22) Filed: Jul. 29, 2003

(65) Prior Publication Data

US 2005/0025233 A1   Feb. 3, 2005

(51) Int. Cl.
  *G06F 15/16* (2006.01)
(52) U.S. Cl. .............. 709/247; 709/232; 358/1.15; 358/402; 358/426.03; 358/448; 382/232; 707/101; 714/708
(58) Field of Classification Search ............. 709/232, 709/247, 223, 248; 707/101; 358/1.15; 714/708; 382/232
See application file for complete search history.

(56) References Cited

U.S. PATENT DOCUMENTS

| | | | | |
|---|---|---|---|---|
| 5,047,955 A | * | 9/1991 | Shope et al. | 358/1.12 |
| 5,454,079 A | * | 9/1995 | Roper et al. | 709/247 |
| 5,479,587 A | * | 12/1995 | Campbell et al. | 358/1.17 |
| 5,572,632 A | * | 11/1996 | Laumeyer et al. | 358/1.17 |
| 5,768,424 A | * | 6/1998 | Long | 382/232 |
| 5,968,132 A | * | 10/1999 | Tokunaga et al. | 709/247 |
| 5,999,272 A | * | 12/1999 | Dow et al. | 358/1.15 |
| 6,138,164 A | * | 10/2000 | Kobata et al. | 709/231 |
| 6,348,969 B1 | * | 2/2002 | Ikeda | 358/1.15 |
| 6,453,071 B2 | * | 9/2002 | Ito et al. | 382/232 |
| 6,469,986 B1 | * | 10/2002 | Lecheler et al. | 370/252 |
| 6,625,671 B1 | * | 9/2003 | Collette et al. | 710/52 |
| 6,708,220 B1 | * | 3/2004 | Olin | 709/247 |
| 6,842,768 B1 | * | 1/2005 | Shaffer et al. | 709/203 |
| 6,891,631 B1 | * | 5/2005 | Nakazato | 358/1.13 |
| 7,024,045 B2 | * | 4/2006 | McIntyre | 382/239 |
| 2001/0047359 A1 | * | 11/2001 | Videcrantz et al. | 707/101 |
| 2002/0015180 A1 | * | 2/2002 | Tominaga | 358/1.15 |
| 2002/0076245 A1 | * | 6/2002 | Aiyama | 400/61 |
| 2002/0154331 A1 | * | 10/2002 | Yamauchi et al. | 358/1.15 |
| 2004/0103215 A1 | * | 5/2004 | Ernst et al. | 709/247 |
| 2005/0069363 A1 | * | 3/2005 | Aoki et al. | 400/76 |
| 2006/0195464 A1 | * | 8/2006 | Guo | 707/101 |

* cited by examiner

*Primary Examiner*—Michael Won
(74) *Attorney, Agent, or Firm*—Ormiston & McKinney, PLLC

(57) ABSTRACT

A method for preparing electronic data for transmission includes calculating a duration for compressing the electronic data, calculating a duration for transmitting the electronic data if not compressed, and compressing the electronic data only if the duration for compressing does not exceed the duration for transmitting.

17 Claims, 4 Drawing Sheets

PREPARING ELECTRONIC DATA FOR TRANSMISSION

BACKGROUND

With a word processor or other desktop publishing application, a user can open or create an electronic document. To print, the application, with use of an operating system, sends instructions to a print driver to assemble a print job for a laser printer or other image forming device. The print driver acts as a translator between the application and the image forming device, transforming generic printing instructions received from the application into device specific instructions—print jobs—capable of being acted upon by the image forming device.

An electronic document can be made of up of text, line-art, and/or raster data. Text and line art, as compared to raster data, require relatively small amounts of memory. Raster data are pixels selected and arrange to reveal one or more images. For black and white images, each pixel can be represented by a single bit. A high quality, color image can require forty bits to define each pixel. A relatively small 800×600 pixel high quality, color image, then, can be 19,200,000 bits or 2.4.megabytes in size.

Once the print job is assembled, the print driver transmits the print job through a physical computer port to the image forming device. Port examples include wired or wireless Ethernet, USB (Universal Serial Bus), parallel, serial, and infra-red ports. Different ports have different transmit rates. For example a print job sent through an Ethernet port will be delivered more quickly than a print job sent through a serial port. Smaller print jobs are transmitted relatively quickly regardless of the type of port used. However, a larger print job—for example, a job containing a large amount of raster data—can require a noticeable amount of time to be transmitted resulting in a significant delay when transmitted through a slower port.

DETAILED DESCRIPTION

INTRODUCTION: To decrease time it takes to transmit a print job to an image forming device, the print job or a portion of the print job can be compressed. However, compressing and decompressing also take time. So long as the time required to compress and decompress does not exceed the time saved by transmitting an at least partially compressed print job, a decrease in overall printing time can be realized. Various embodiments of the present invention operate to compare an expected time delay caused by compressing and decompressing electronic data with the time saved by transmitting the electronic data if compressed. If the time saved is greater than the time to transmit the data uncompressed, then the electronic data is compressed and transmitted. Otherwise, the electronic data is transmitted but not compressed.

Figure 1:
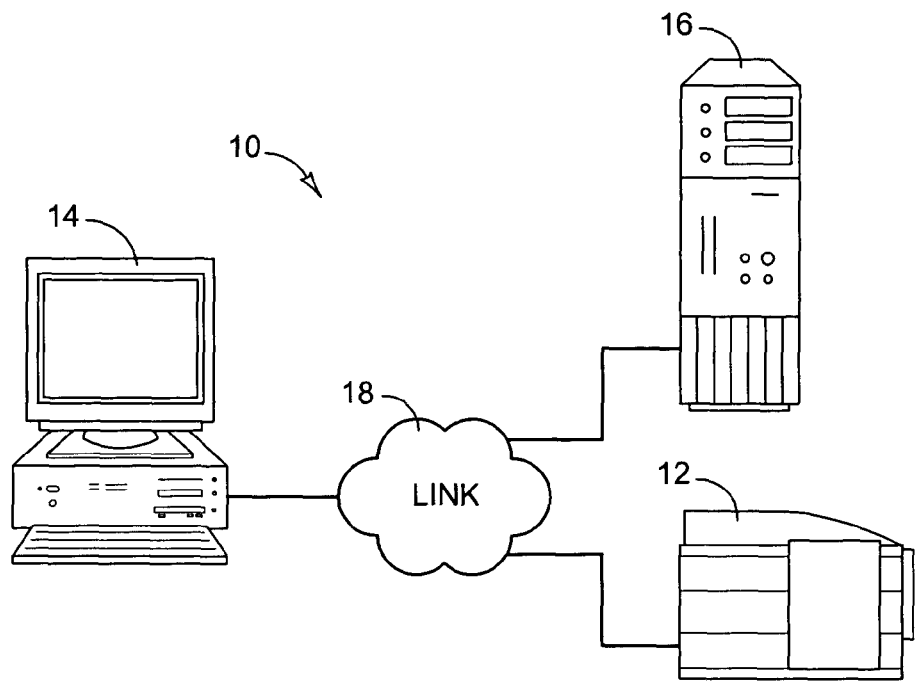
FIG. 1 illustrates an exemplary computing environment in which embodiments of the present invention can be implemented.

COMPONENTS: FIG. 1 illustrates an exemplary computing environment 10 in which various embodiments of the present invention may be implemented. Environment 10 includes image forming device 12, computer 14, and print server 16. Image forming device 12 represents any device capable of forming a printed image on a page. Examples include laser printers, ink printers, copiers, facsimile devices, commercial printing presses, and multi-function all-in-one devices. Computer 14 represents any computing device capable of sending a print job to be printed by image forming device 12. A print job is a series of instructions directing image forming device 12 to form physical representation(s) of en electronic document on one or more pages. The term page includes a sheet of paper and any other print media such as, but not limited to, an envelope or transparency. Print job instructions can include directions to form text, graphics, or a combination of both.

Image forming device 12 is capable of processing and printing one print job at a time. Print server 16 represents any computing device capable of managing multiple print jobs simultaneously sent to image forming device 12. Link 18 interconnects image forming device 12, computer 14, and print server 16. Link 18 represents generally a cable, wireless, or remote connection via a telecommunication link, an infrared link, a radio frequency link, or any other connector or system of connectors that provide electronic communication between image forming device 12, computer 14, and print server 16. Link 18 may include an intranet, the Internet, or a combination of both. The portion of link 18 connecting computer 14 to print server 16 may be different than the portion of link 18 connecting print server 16 to image forming device 12. For example computer 14 may be connected to print server 16 via an Ethernet connection. Print server 16 may be connected to image forming device via a parallel connection.

Figure 2:
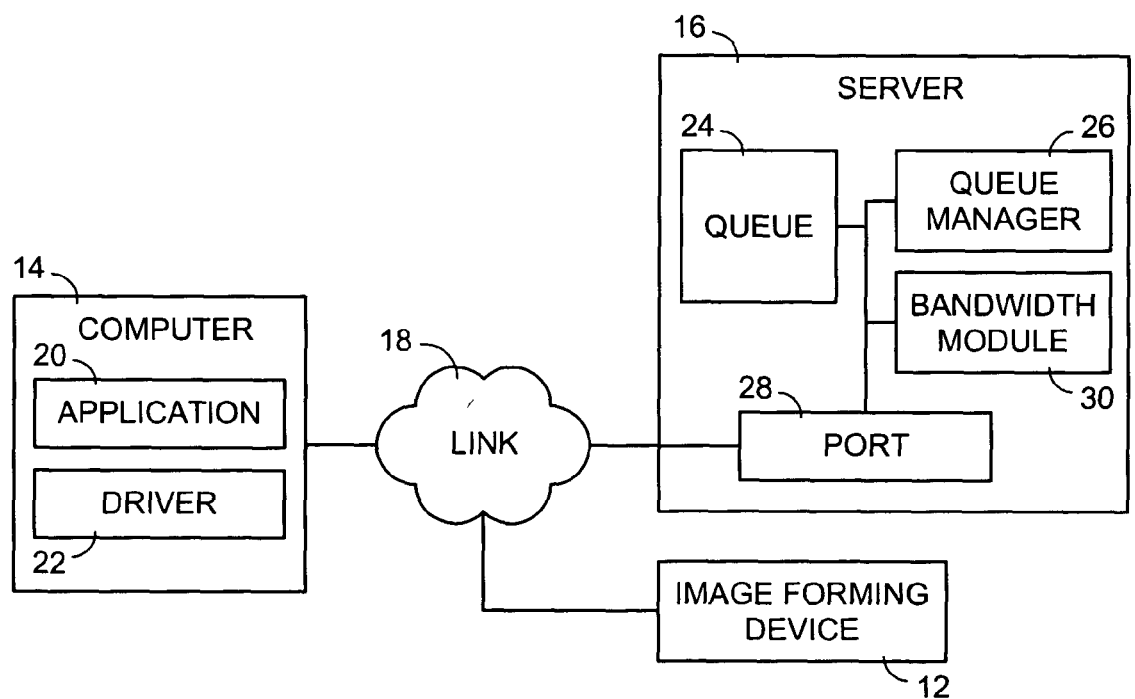
FIG. 2 is a block diagram that illustrates programming in the computing environment of FIG. 1 according to an embodiment of the present invention.

Referring now to FIG. 2, computer 14 includes application 20 and driver 22. Application 20 represents any programming capable of instructing that an electronic document be printed. For example, application 20 may be a word processor or other desktop publishing application. Driver 22 provides programming for translating printing instructions from application 20 into device-specific instructions—a print job—for image forming device 12. Driver 22 is also capable of selectively compressing a print job or portion thereof. For example, where a print job includes text, line art, and raster data, driver 22 can compress the entire print job or selectively compress only the raster data. Not shown is an operating system that facilitates electronic communication between application 20 and driver 22.

Print server 16 includes queue 24, queue manager 26, port 28, and bandwidth module 30. Queue 24 represents generally a temporary electronic holding bin for print jobs directed to a busy or malfunctioning image forming device 12. Queue manager 26 represents generally any programming capable of administering print jobs within queue 24. For example, queue manager 26 intercepts print jobs directed to image forming device 12 and places them in queue 24. As image forming device 12 becomes available, queue manger 26 releases the print jobs one by one from queue 24. It is noted that queue manager 26 may also perform the functions of driver 22. For example, application 20 may send printing instructions directly to queue 24. Queue manager 26, then, translates those instructions into a print job for image forming device 12.

Port 28 represents a physical interface through which print jobs are transmitted from print server 16 en route to image forming device 12. Bandwidth module 30 represents generally any programming capable of supplying data relating a transmit rate at which print jobs are transmitted to image forming device 12. A transmit rate is the rate at which electronic data such as a print job can be sent through port 28. Transmit rates are typically measured in bytes per second. Bandwidth module 30 can identify a transmit rate in a variety of manners. This includes but is not limited to identifying the transmit rate according to the port through which print jobs are transmitted as well as calculating a transmit rate by measuring the time it takes a print job to leave a print queue. While bandwidth module 30 is shown running on server 16, it may instead be found on computer 14 or any other computing device interconnected with computer 14 and server 16.

Figure 3:
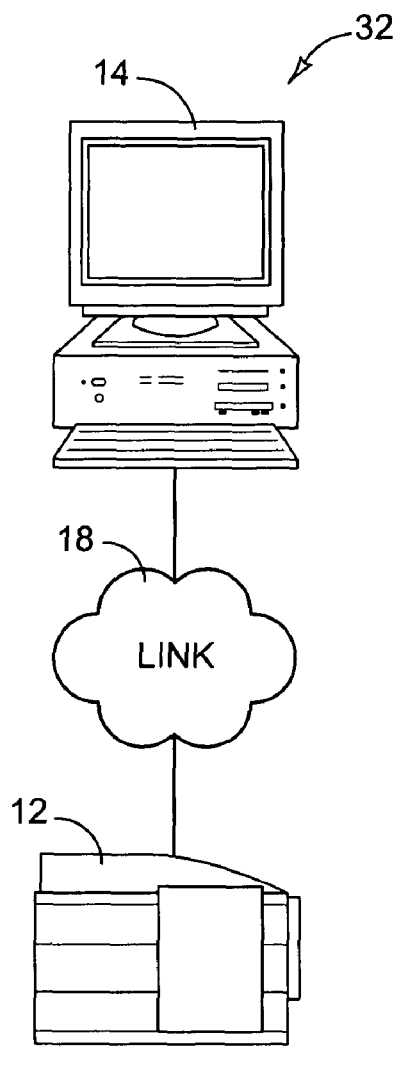
FIG. 3 illustrates another exemplary computing environment in which embodiments of the present invention can be implemented.
Figure 4:
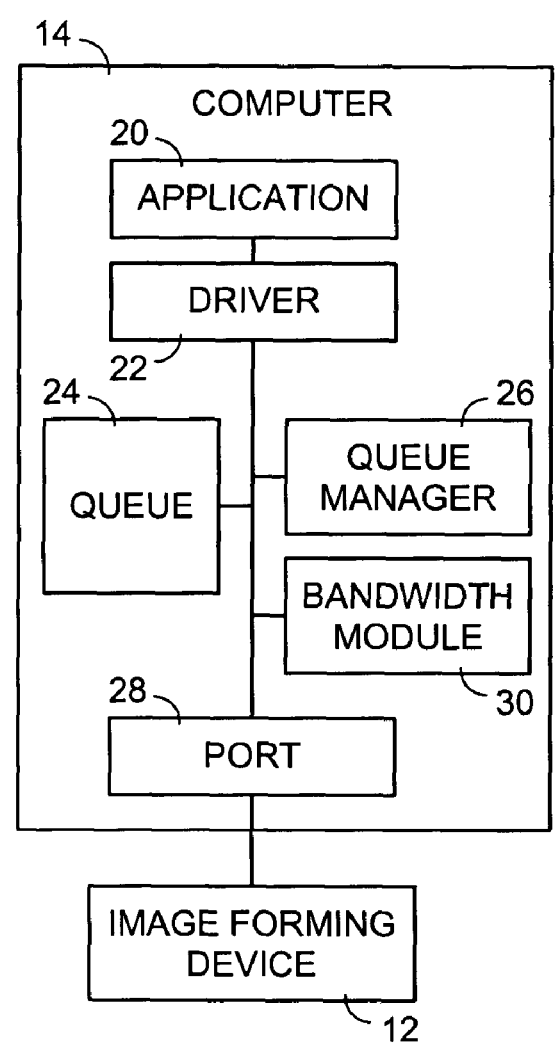
FIG. 4 a block diagram that illustrates programming in the computing environment of FIG. 3 according to an embodiment of the present invention.

FIG. 3 illustrates another exemplary computing environment 32 in which embodiments of the present invention may also be implemented. In computing environment 32, computer 14 and image forming device 12 are interconnected by link 18. Print server 16 is not present. Referring now to FIG. 4, computer 14, in addition to application 20 and driver 22, includes queue 24, queue manager 26, port 28, and bandwidth module 30.

Figure 5:
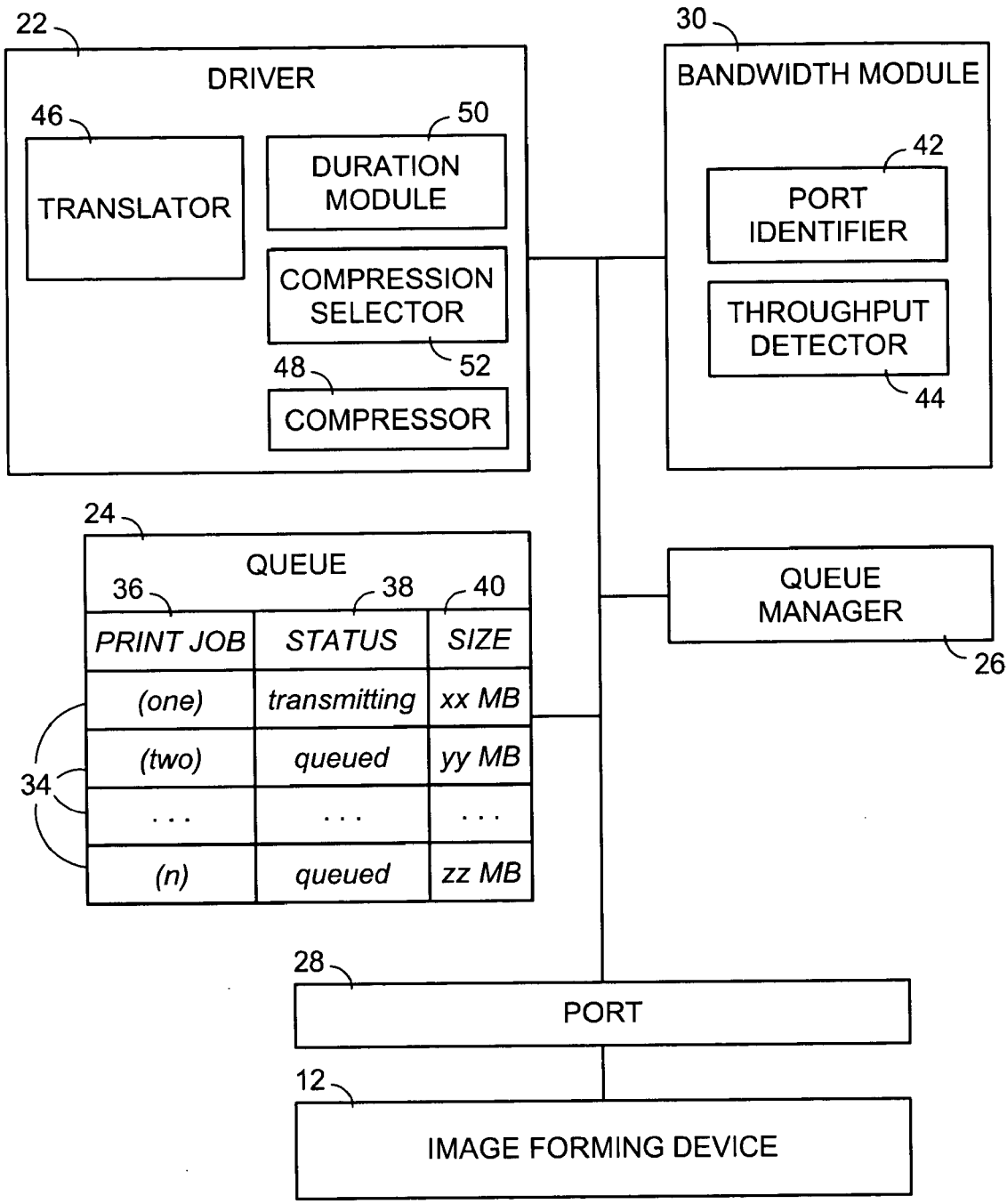
FIG. 5 is block diagram further illustrating programming for implementing an embodiment of the present invention.

Without regard to their location, FIG. 5 helps to further illustrate driver 22, queue 24, and bandwidth module 30. As an example, queue 24 is holding a number of print jobs 34. Each print job has an identifier 36, a status 38, and a size 40. In the example of FIG. 5, print job (one) is transmitting, meaning that it is being sent to image forming device 12. The other print jobs are queued meaning that each is being held until image forming device 12 is ready to print it.

Bandwidth module 30 includes port identifier 42 and throughput detector 44. It is noted however that bandwidth module 30, while shown as including both components 42 and 44, need only include one or the other. Port identifier 42 and throughput detector 44 each represent programming capable of supplying driver 22 with a transmit rate for port 28. In doing so, port identifier 42 infers a transmit rate based on the type of port 28. For example, port identifier 42 may identify port 28 as being of a specific type—for example—as being a parallel port, a USB port, an Ethernet port, or an infra-red port. Ports of specific types are capable of known or assumed transmit rates. Once port identifier 42 identifies the type of port 28, a transmit rate can be inferred and supplied to driver 22. Port identifier 42, for example, may be programmed with assumed transmit rates for ports of varying types. By identifying the a port type, port identifier 42 can supply driver 22 with an assumed transmit rate for that port.

Throughput detector 44 represents generally any programming capable of measuring and supplying the actual transmit rate for port 28 to driver 22. For example, throughput detector 44 may monitor queue 24. Noting when queue manager 26 releases a print job 34, throughput detector 44 measures a time required to transmit that print job. With the size 40 of the print job known, throughput detector 40 can calculate the transmit rate—size divided by time.

Driver 22 includes translator 46, compressor 48, duration module 50, and compression selector 52. Translator 46 represents generally any programming capable of translating the generic printing instructions received from application 20 into device specific printing instructions—a print job—for image forming device 12. Compressor 48 represents generally any programming capable of compressing electronic data like a print job or a portion of a print job like raster data. Where compressor 48 compresses raster data, it may do so using JPEG (Joint Photographic Experts Group) compression. JPEG is a lossy compression technique that can reduce raster data file size by up to ninety-five percent.

Duration module 50 represents generally any programming capable of (1) calculating a duration for compressing and decompressing a print job or portions of a print job; (2) calculating a duration for transmitting the print job if not compressed; (3) and calculating a duration for transmitting the print job if compressed. Noting a size of the print job, duration module 50 can calculate a compression/decompression time (C/DT)—that is, the time delay caused by compressing before transmitting and then decompressing by image forming device 12 before printing. The duration for decompressing may, for example, be calculated based upon presumed capabilities of image forming device 12. Noting a size of the uncompressed print job and a transmit rate supplied by bandwidth module 30, duration module 50 can calculate an uncompressed transmit time (UTT). Noting the size of the uncompressed print job, duration module 50 can predict a new size of the print job if compressed. Based on the compressed size and the transmit rate, duration module 50 can calculate a compressed transmit time (CTT).

Compression selector 52 represents generally any programming capable of selectively instructing compressor 48 to either compress or not compress. Compression selector 52 can do so by determining whether the time saved by compressing exceeds a delay caused by compressing and decompressing—in other words—whether UTT-CTT>C/DT. If so, compression selector 52 instructs compressor 48 to compress. Otherwise, compression selector 52 instructs compressor 48 not to compress.

It is noted that compressor 48, duration module 50, and compression selector 52 may be provided on print server 16 (see FIG. 2) rather than driver 22. As noted above, queue manager 26 may perform the functions of driver 22. Application 20 may send printing instructions directly to queue 24. Queue manager, then, translates those instructions into a print job for image forming device 12.

The block diagrams of FIGS. 2, 4, and 5 show the architecture, functionality, and operation of various embodiments of the present invention. Each block may represent in whole or in part a module, segment, or portion of code that comprises one or more executable instructions to implement the specified logical function(s). Each block may represent a circuit or a number of interconnected circuits to implement the specified logical function(s). It is noted that in FIGS. 2 and 4, the operating systems of computer 14 and server 16 are not shown. Those operating systems provide software platforms on top of which application 20, driver 22, queue manager 26, and bandwidth module 30 run. A number of the interactions between the programming elements running on computer 14 and server 16 are facilitated by those operating systems.

Also, the present invention can be embodied in any computer-readable media for use by or in connection with an instruction execution system such as a computer/processor based system or an ASIC (Application Specific Integrated Circuit) or other system that can fetch or obtain the logic from computer-readable media and execute the instructions contained therein. "Computer-readable media" can be any media that can contain, store, or maintain programs and data for use by or in connection with the instruction execution system. Computer readable media can comprise any one of many physical media such as, for example, electronic, magnetic, optical, electromagnetic, infrared, or semiconductor media. More specific examples of suitable computer-readable media include, but are not limited to, a portable magnetic computer diskette such as floppy diskettes or hard drives, a random access memory (RAM), a read-only memory (ROM), an erasable programmable read-only memory, or a portable compact disc.

OPERATION: The operation of embodiments of the present invention will now be described with reference to the exemplary flow diagram of FIG. 6. Electronic data is received (step 54). For example, driver 22 receives printing instructions from application 20 and translates the instructions into a print job that includes raster data. A transmit rate is identified (step 56). With reference to FIG. 5, this is accomplished by bandwidth module 30 which may either infer a transmit rate by identifying port 28 or detect an actual transmit rate by monitoring queue 24.

The time required to compress and later decompress (C/DT) the electronic data is calculated (step 58). Duration module 50 can do so by noting the uncompressed size of the electronic data and the type of compression to be used. For example, compressing and decompressing raster data of a known size using JPEG compression takes a predictable amount of time. A compressed transmit time (CTT) and an uncompressed transmit time (UTT) are calculated (steps 60 and 62). Duration module 50 can do so by noting the uncompressed size of the electronic data, calculating the compressed size of the electronic data, and then using the transmit rate identified in step 56 to calculate transmit times for both sizes.

It is then determined whether C/DT+CTT>UTT (step 64). In other words it is determined whether the time required to compress and decompress the electronic data plus the time for transmitting the electronic data if compressed exceeds the time for transmitting the electronic data if not compressed. If it does not, the electronic data is compressed (step 66). Otherwise, the electronic data is not compressed (step 68). In either case, the electronic data is then transmitted (step 70).

Figure 6:
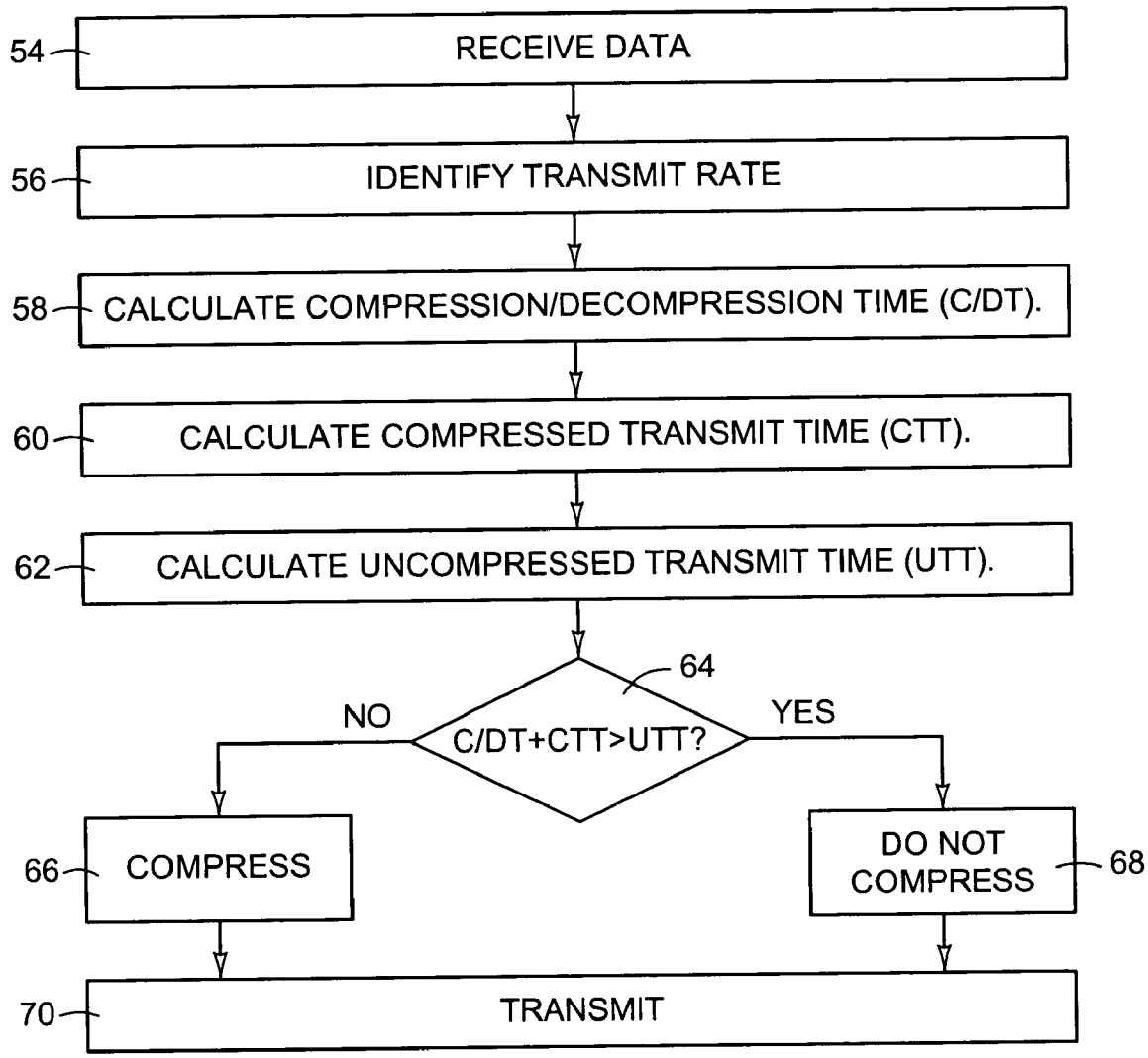
FIG. 6 is an exemplary flow diagram illustrating steps taken to practice an embodiment of the present invention.

Although the flow chart of FIG. 6 shows a specific order of execution, the order of execution may differ from that which is depicted. For example, the order of execution of two or more blocks may be scrambled relative to the order shown. Also, two or more blocks shown in succession may be executed concurrently or with partial concurrence. All such variations are within the scope of the present invention.

CONCLUSION: The present invention has been shown and described with reference to the foregoing exemplary embodiments. It is to be understood, however, that other forms, details, and embodiments may be made without departing from the spirit and scope of the invention which is defined in the following claims.

What is claimed is:

1. A method for preparing electronic data for transmission, comprising calculating a combined duration for compressing and decompressing the electronic data, calculating a duration for transmitting the electronic data if not compressed, calculating a duration for transmitting the electronic data if compressed, and compressing the electronic data only if the combined duration summed with the duration for transmitting the electronic data if compressed does not exceed the duration for transmitting the electronic data if not compressed, wherein calculating the duration for transmitting the electronic data if not compressed includes:

measuring a duration for transmitting other electronic data;
identifying a size of the other electronic data;
calculating a transmit rate based on the measured duration for transmitting the other electronic data and the identified size of the other electronic data; and
calculating a duration for transmitting the electronic data according to a size of the electronic data and the transmit rate; and wherein one or more of the acts of calculating a combined duration, calculating a duration for transmitting the electronic data if not compressed, calculating a duration for transmitting the electronic data if compressed, and compressing the electronic data are implemented by a print driver.

2. A method for preparing a print job containing raster data, comprising:

calculating a combined duration for compressing and decompressing the raster data;
calculating a duration for transmitting the print job if the raster data is not compressed;
calculating a duration for transmitting the print job if the raster data is compressed; and
compressing the raster data only if the combined duration summed with the duration for transmitting the print job if the raster data is compressed does not exceed the duration for transmitting the print job if the raster data is not compressed;

wherein calculating a duration for transmitting the print job if the raster data is not compressed includes:
measuring a duration for transmitting a prior print job;
identifying a size of the prior print job;
calculating the transmit rate for the prior print job based on the measured duration for transmitting the prior print job and the identified size of the prior print job;
calculating the duration for transmitting the according to a size of the print job and the transmit rate; and wherein one or more of the acts of calculating a combined duration, calculating a duration for transmitting the print job if the raster data is not compressed, calculating a duration for transmitting the print job if the raster data is compressed, and compressing the raster data are implemented by a print driver.

3. The method of claim 2, further comprising transmitting the print job to an image forming device.

4. The method of claim 2, wherein measuring a duration comprises measuring a duration for transmitting the prior print job from a print queue to an image forming device.

5. A computer readable storage medium having instructions stored thereon for calculating a combined duration for compressing and decompressing the electronic data, calculating a duration for transmitting the electronic data if not compressed, calculating a duration for transmitting the electronic data if compressed, and compressing the electronic data only if the combined duration summed with the duration for transmitting the electronic data if compressed does not exceed the duration for transmitting the electronic data if not compressed, wherein the instructions for calculating the duration for transmitting the electronic data if not compressed includes instructions for:

measuring a duration for transmitting other electronic data;
identifying a size of the other electronic data;
calculating a transmit rate based on the measured duration for transmitting the other electronic data and the identified size of the other electronic data; and calculating a duration for transmitting the electronic data according to a size of the electronic data and the transmit rate; and wherein one or more of the acts of calculating a combined duration, calculating a duration for transmitting the electronic data if not compressed, calculating a duration for transmitting the electronic data if compressed, and compressing the electronic data are implemented by a print driver.

6. A computer readable storage medium having instructions stored thereon for:
- calculating a combined duration for compressing and decompressing the raster data;
- calculating a duration for transmitting if the print job if the raster data is not compressed;
- calculating a duration for transmitting the print job if the raster data is compressed; and
- compressing the raster data only if the combined duration summed with the duration for transmitting the print job if the raster data is compressed does not exceed the duration for transmitting the print job if the raster data is not compressed;
- wherein the instructions for calculating a duration for transmitting the print job if the raster data is not compressed include instructions for:
- measuring a duration for transmitting a prior print job;
- identifying a size of the prior print job;
- calculating the transmit rate for the prior print job based on the measured duration for transmitting the prior print job and the identified size of the prior print job;
- calculating the duration for transmitting the print job according to a size of the print job and the transmit rate; and
- wherein one or more of the acts of calculating a combined duration, calculating a duration for transmitting the print job if the raster data is not compressed, calculating a duration for transmitting the print job if the raster data is compressed, and compressing the raster data are implemented by a print driver.

7. the medium of claim 6, having further instruction for transmitting the print job to an image forming device.

8. The medium of claim 6, wherein the instructions for measuring a duration include instructions for measuring a duration for transmitting the prior print job from a print queue to an image forming device.

9. A system for preparing a print job containing raster data, comprising:
- a bandwidth module operable to supply data relating to a transmit rate for the print job;
- a duration module operable to calculate a combined duration for compressing and decompressing the raster data and to calculate, based on a transmit rate supplied by the bandwidth module, a duration for transmitting the print job if the raster data is not compressed and a duration for transmitting the print job if the raster data is compressed; and
- a compression selector operable to instruct that the raster data be compressed only if the combined duration summed with the duration for transmitting the print job if the raster data is compressed does not exceed the duration for transmitting the print job if the raster data is not compressed,
- wherein the bandwidth module is operable to measure a duration for transmitting a prior print job, identify a size of the prior print job, and calculate a transmit rate for the prior print job based on the measured duration for transmitting the prior print job and the identified size of the prior print job;
- wherein the duration module is operable to calculate the duration for transmitting the print job according to a size of the print job and the transmit rate of the other prior print job; and
- wherein one or more of the bandwidth modules, duration module, and the compression selector are programming elements of a printer driver.

10. The system of claim 9, wherein the bandwidth module is operable to supply data identifying a port through which the print job will be transmitted en route to an image forming device, and wherein the duration module is operable to calculate the duration for transmitting the print job by identifying a transmit rate for the port and calculating the duration according to the transmit rate for the port and a size of the print job.

11. The system of claim 9, wherein the bandwidth module is operable to identify a port through which the print job will be transmitted, identify an assumed transmit rate for that port, and supply the duration module with the assumed transmit rate.

12. The system of claim 9, wherein the bandwidth module is operable to measure the duration by measuring a duration for transmitting the prior print job from a print queue to an image forming device.

13. A print server, comprising:
- a print queue;
- a queue manager operable to administer print jobs in a queue;
- a bandwidth module operable to supply data relating to a transmit rate for a print job;
- a duration module operable to calculate a combined duration for compressing and decompressing raster data contained in a print job and to calculate, based on a transmit rate supplied by the bandwidth module, a duration for transmitting the print job if the raster data is not compressed and a duration for transmitting the print job if the raster data is compressed; and
- a compression selector operable to instruct that the raster data be compressed only if the combined duration summed with the duration for transmitting the print job if the raster data is compressed does not exceed the duration for transmitting the print job if the raster data is not compressed,
- wherein the bandwidth module is operable to measure a duration for transmitting a prior print job, identify a size of the prior print job, and calculate a transmit rate for the prior print job based on the measured duration for transmitting the prior print job and the identified size of the prior print job;
- wherein the duration module is operable to calculate the duration for transmitting the print job according to a size of the print job and the transmit rate of the prior print job; and
- wherein one or more of the bandwidth modules, duration module, and the compression selector are programming elements of a printer driver.

14. A system for preparing electronic data for transmission, comprising:
- means for calculating a combined duration for compressing and decompressing the electronic data;
- means for calculating a duration for transmitting the electronic data if not compressed;
- means for calculating a duration for transmitting the electronic data if compressed;

means for compressing the electronic data only if the combined duration summed with the duration for transmitting the electronic data if compressed does not exceed the duration for transmitting electronic data if not compressed;

wherein the means for calculating the duration for transmitting the electronic data if not compressed include:

means for measuring a duration for transmitting other electronic data;

means for identifying a size of the other electronic data;

means for calculating a transmit rate based on the measured duration for transmitting the other electronic data and the identified size of the other electronic data; and means for calculating the duration for transmitting the electronic data according to a size of the electronic data and the transmit rate; and wherein one or more of the means for calculating a combined duration, means for calculating a duration for transmitting the electronic data if not compressed, means for calculating a duration for transmitting the electronic data if compressed, and means for compressing the electronic data are programming elements of a print driver.

15. A system for preparing a print job containing raster data, comprising:

means for calculating a combined duration for compressing and decompressing the raster data;

means for calculating a duration for transmitting the print job if the raster data is not compressed;

means for calculating a duration for transmitting the print job if the raster data is compressed;

means for compressing the raster data only if the combined duration summed with the duration for transmitting the print job if the raster data is compressed does not exceed the duration for transmitting the print job if the raster data is not compressed;

wherein the means for calculating a duration for transmitting the print job if the raster data is not compressed include:

means for measuring a duration for transmitting other raster data;

means for identifying a size of the other raster data;

means for calculating a transmit rate based on the measured duration for transmitting the other raster data and the identified size of the other raster data; and means for calculating the duration for transmitting the raster data according to a size of the raster data and the transmit rate; and wherein one or more of the means for calculating a combined duration, means for calculating a duration for transmitting the print job if the raster data is not compressed, means for calculating a duration for transmitting the print job if the raster data is compressed, and means for compressing are programming elements of a print driver.

16. The system of claim 15, wherein the means for supplying is a means for supplying data relating to a port through which the print job will travel en route to an image forming device.

17. The system of claim 15, wherein the means for supplying is a means for supplying a transmit rate for a prior print job.

* * * * *